United States Patent
Borgen

(10) Patent No.: US 6,608,576 B1
(45) Date of Patent: Aug. 19, 2003

(54) PULSE CODE MODULATION ENCODER FOR DATA ACQUISITION

(75) Inventor: Gary Steward Borgen, Camarillo, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/238,516

(22) Filed: Aug. 20, 2002

(51) Int. Cl.$^7$ ................................................. H03M 3/00
(52) U.S. Cl. ....................... 341/143; 341/101; 341/155; 375/242
(58) Field of Search ................................ 341/143, 155; 375/242

(56) References Cited

U.S. PATENT DOCUMENTS 4,754,257 A * 6/1988 Takahashi ................... 341/157
5,576,980 A * 11/1996 Whetsel ...................... 702/119
5,696,791 A * 12/1997 Yeung ......................... 375/244

* cited by examiner

Primary Examiner—Peguy JeanPierre
(74) Attorney, Agent, or Firm—David Kalmbaugh

(57) ABSTRACT

A programmable pulse code modulation encoder comprises a programmable controller arranged to receive a digital signal input and a plurality of parallel analog signal inputs. The said programmable controller is arranged to digitize the parallel analog signal inputs and modulate them with the digital signal input. A system clock is included to provide clock signals. A counter circuit is connected to the programmable controller to provide interrupt signals under the control of the system clock. A shift register is connected to the programmable controller to receive modulated parallel digital signals corresponding to the parallel analog signal inputs to the programmable controller. The shift register is also connected to the counter and is arranged to function as a parallel to serial converter to provide a serial data stream output at an output terminal of the shift register.

6 Claims, 8 Drawing Sheets

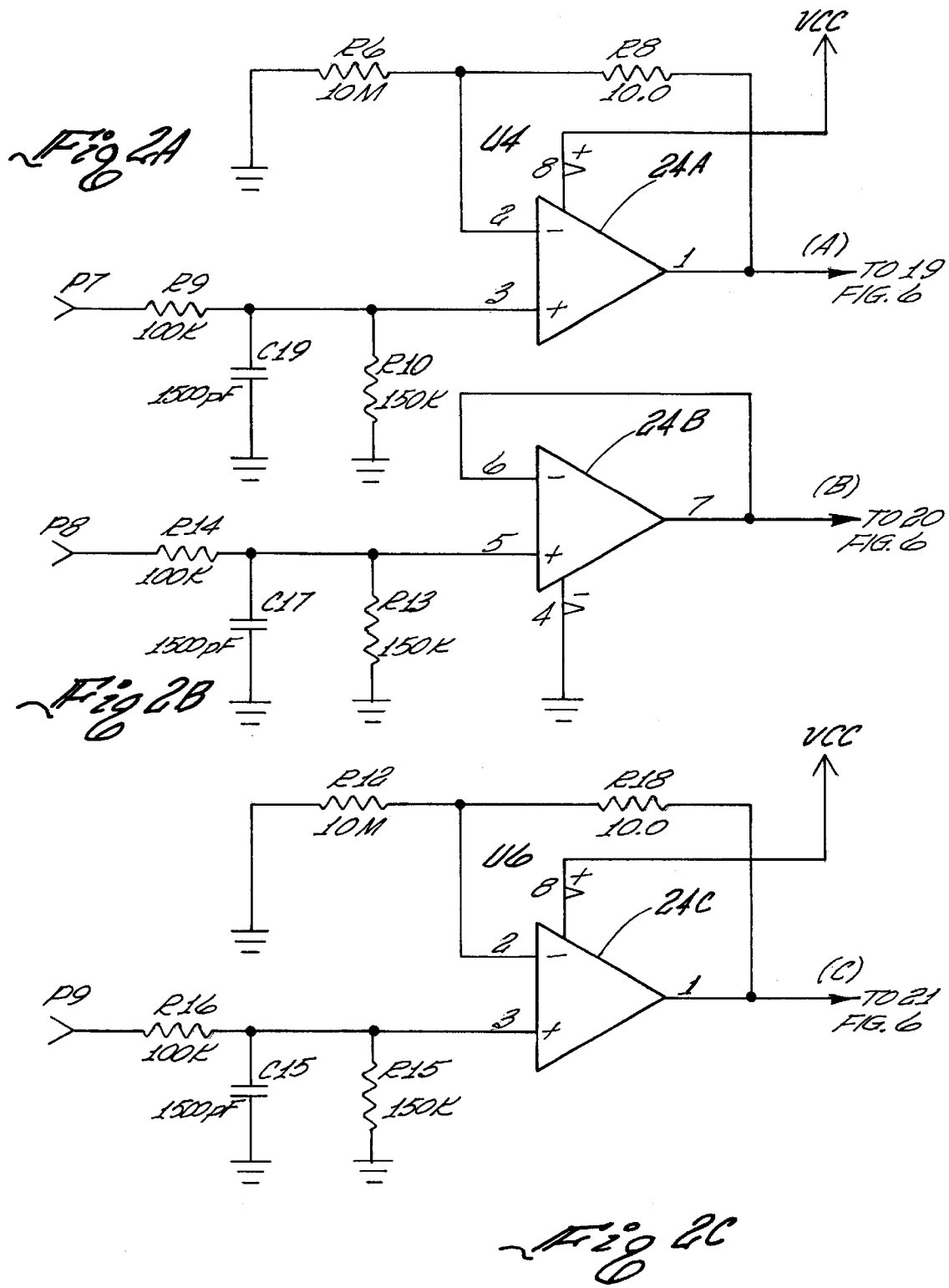

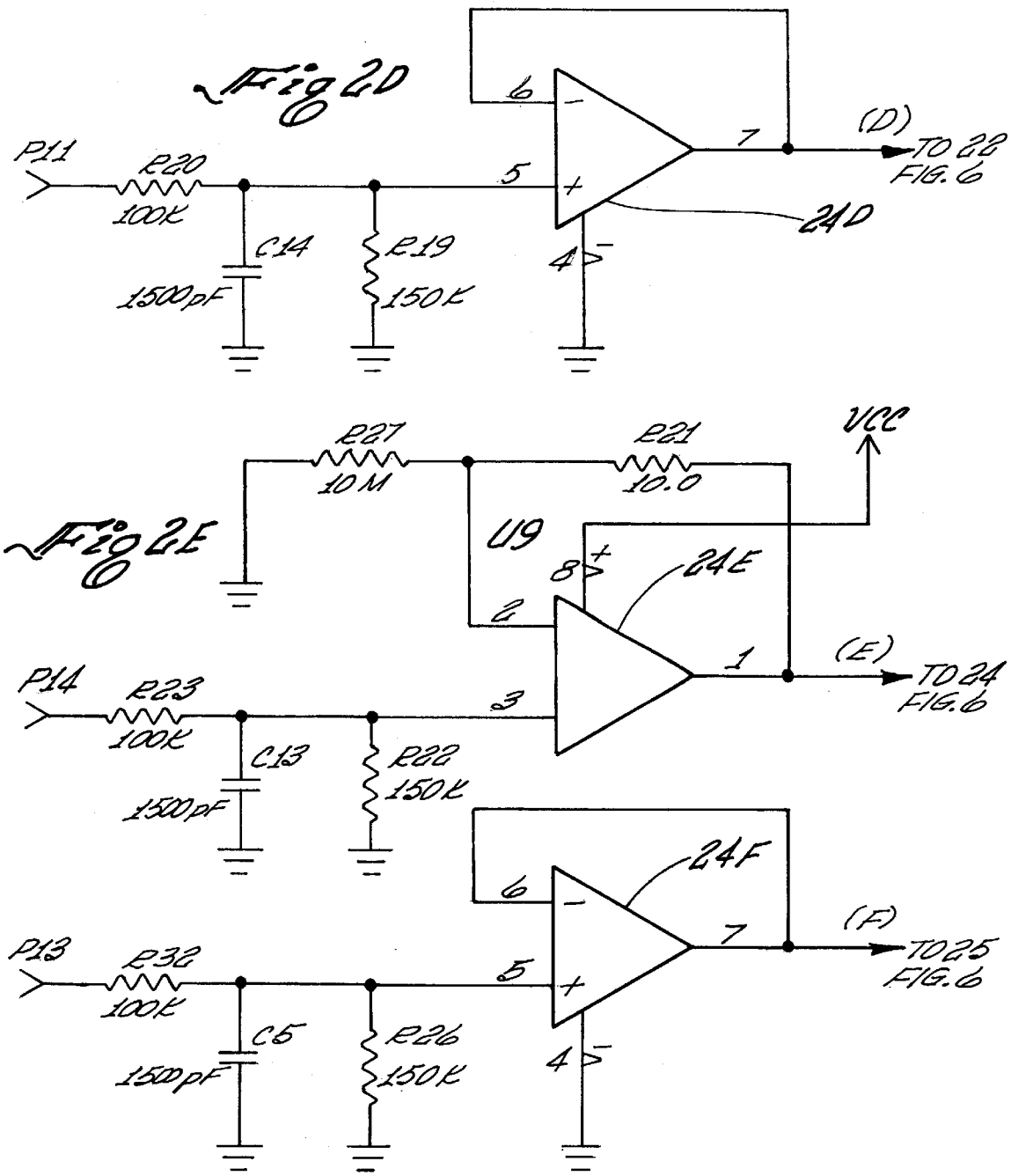

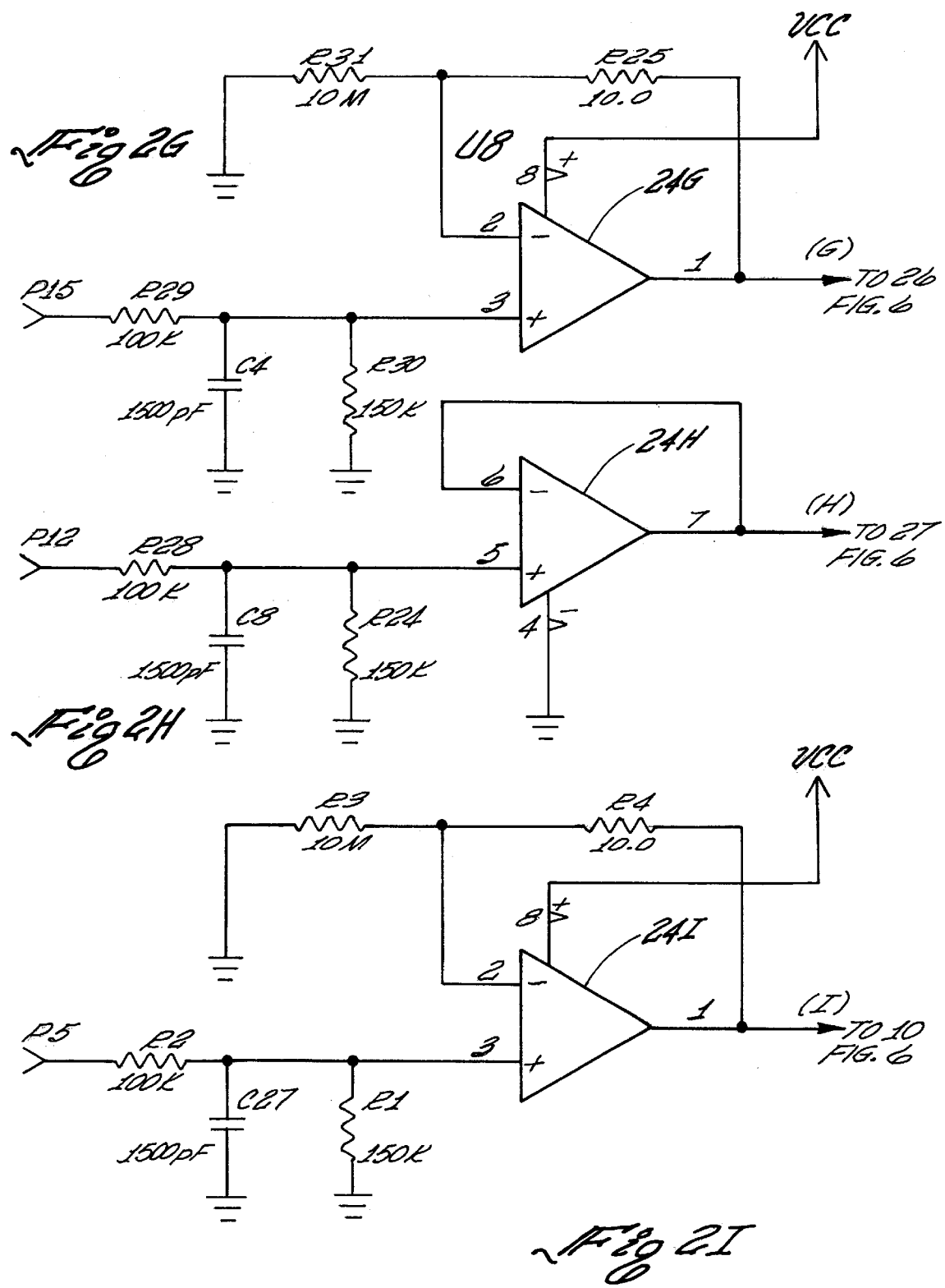

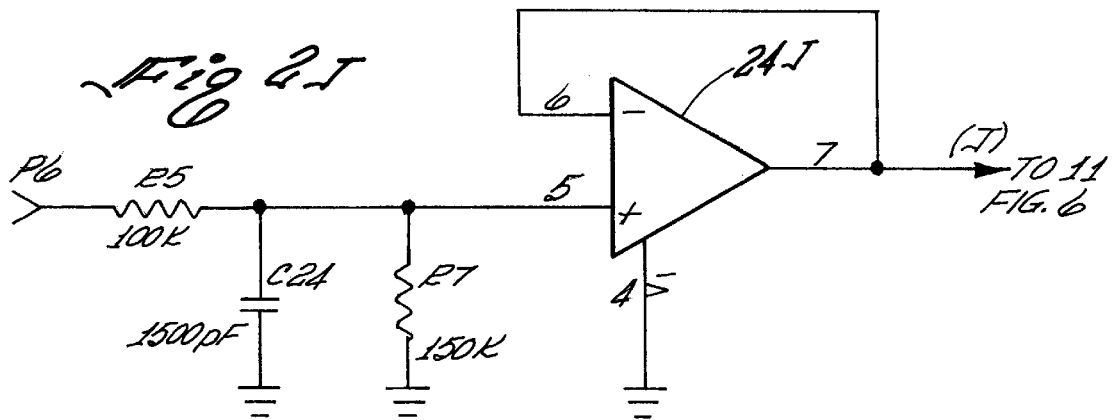
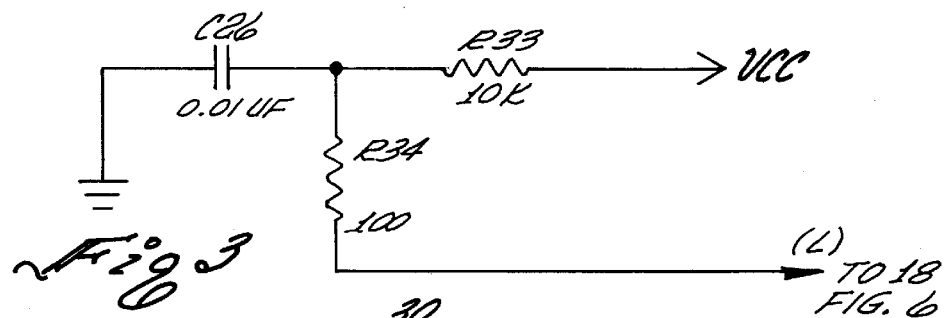
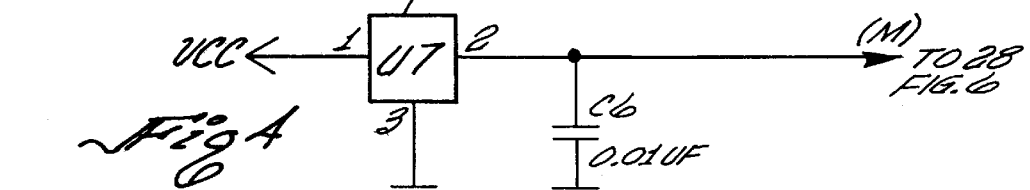
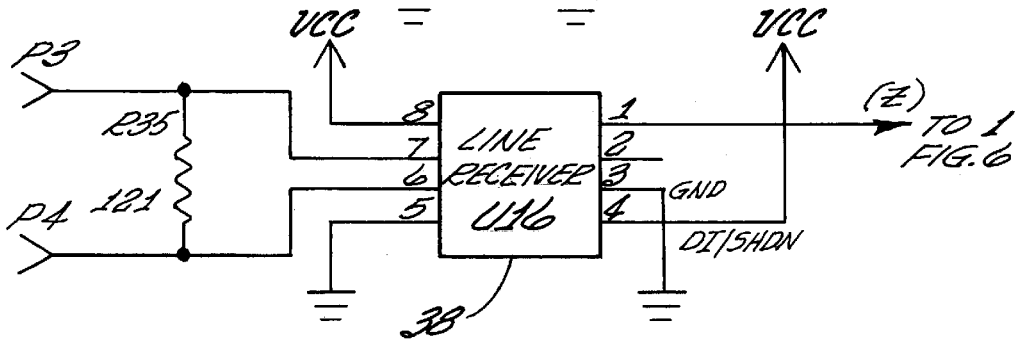

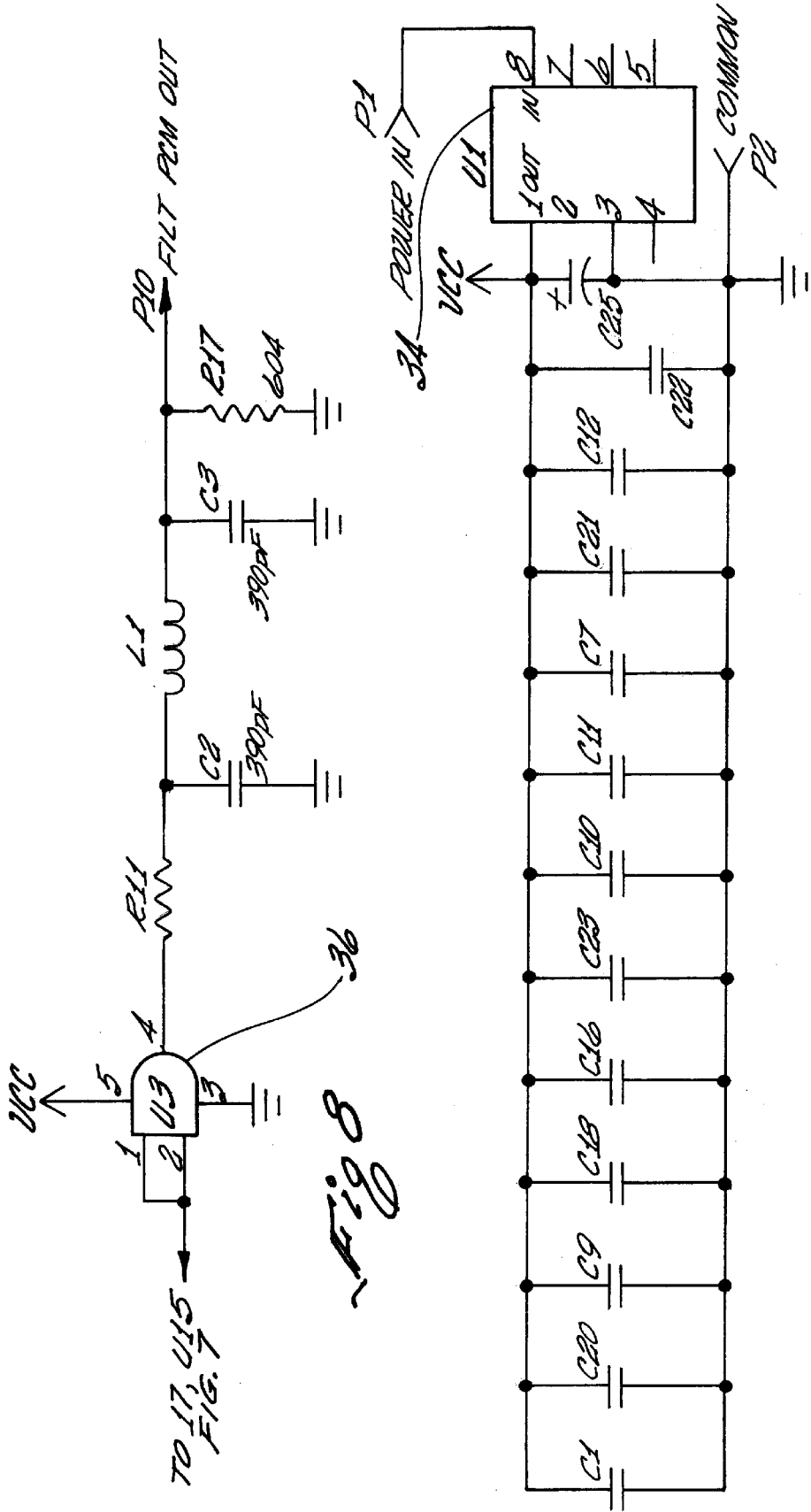

PULSE CODE MODULATION ENCODER FOR DATA ACQUISITION

BACKGROUND OF THE INVENTION

1. Field of the Invention

This invention relates generally to telemetry instrumentation and particularly to a programmable pulse code modulation (PCM) encoder for encoding telemetry data.

2. Description of the Prior Art

Pulse code modulation is a sampling technique for digitizing analog signals. PCM samples the signal 8000 times per second, and each sample is represented by 8 bits for a total of 64 Kb per second. PCM is used with carrier systems that combine PCM signals from many lines and transmit them over a single cable or other medium.

Previous telemetry instrumentation required a custom PCM encoder made of several separate sub components. These sub components have included an analog signal multiplexer to provide a path from the signal being sampled to the input of an analog to digital (A/D) converter. The A/D converter is used to digitize the analog signal selected by the multiplexer. A typical custom PCM encoder also includes a universal asynchronous receiver, a logic controller and a parallel to serial converter. The universal asynchronous receiver receives data from a digital source such as a GPS receiver. The logic controller controls various sub components and formats the PCM data stream. The parallel to serial converter provides a continuous serial PCM output stream.

The logic controller is typically a field programmable gate array (FPGA) set up as a sequencer with its control store including either an external PROM or an internal discrete logic circuit. Because the logic of the FPGA (or code in the PROM) must be programmed by the original equipment manufacturer before being delivered to the user, the resultant PCM encoder is usable only for one, or, at most, a limited set of telemetry instrumentation applications.

SUMMARY OF THE INVENTION

This invention is directed to a programmable PCM encoder that may be used in a variety of telemetry instrumentation applications.

A PCM encoder according to the present invention comprises a programmable controller arranged to receive a digital signal input and a plurality of parallel analog signal inputs. The said programmable controller is arranged to digitize the parallel analog signal inputs and modulate them with the digital signal input. A system clock is included to provide clock signals. A counter circuit is connected to the programmable controller to provide interrupt signals under the control of the system clock. A shift register is connected to the programmable controller to receive modulated parallel digital signals corresponding to the parallel analog signal inputs to the programmable controller. The shift register is also connected to the counter and is arranged to function as a parallel to serial converter to provide a serial data stream output at an output terminal of the shift register.

The pulse code modulation encoder according to the present invention preferably further comprises an operational amplifier array arranged to provide the parallel analog signal inputs to the programmable controller.

The invention preferably further comprises a line receiver connected to the programmable controller. The line receiver is arranged to receive a balanced digital and provide a unipolar digital signal to the programmable controller for modulating digital signals corresponding to the parallel analog signal inputs.

The pulse code modulation encoder according to the present invention preferably further comprises an output buffer connected to the output terminal of the shift register; and a filter circuit connected to the output buffer to provide a filtered, encoded signal output.

The structure and function of the invention may be best understood by referring to the accompanying drawings, which are not to scale, and to the following detailed description.

BRIEF DESCRIPTION OF THE DRAWINGS

FIGS. 2A–2J are schematic diagrams illustrating an operational amplifier array that may be included in the invention;

FIG. 3 illustrates a voltage divider circuit that may be included in the invention;

FIG. 4 illustrates a voltage reference source that may be included in the invention;

FIG. 5 illustrates a line receiver that may be included in the invention;

FIG. 8 illustrates a buffer circuit that may be used to provide output signals from the invention; and FIG. 9 illustrates a voltage regulator circuit that may be included in the invention.

DETAILED DESCRIPTION OF THE INVENTION

Figure 1:
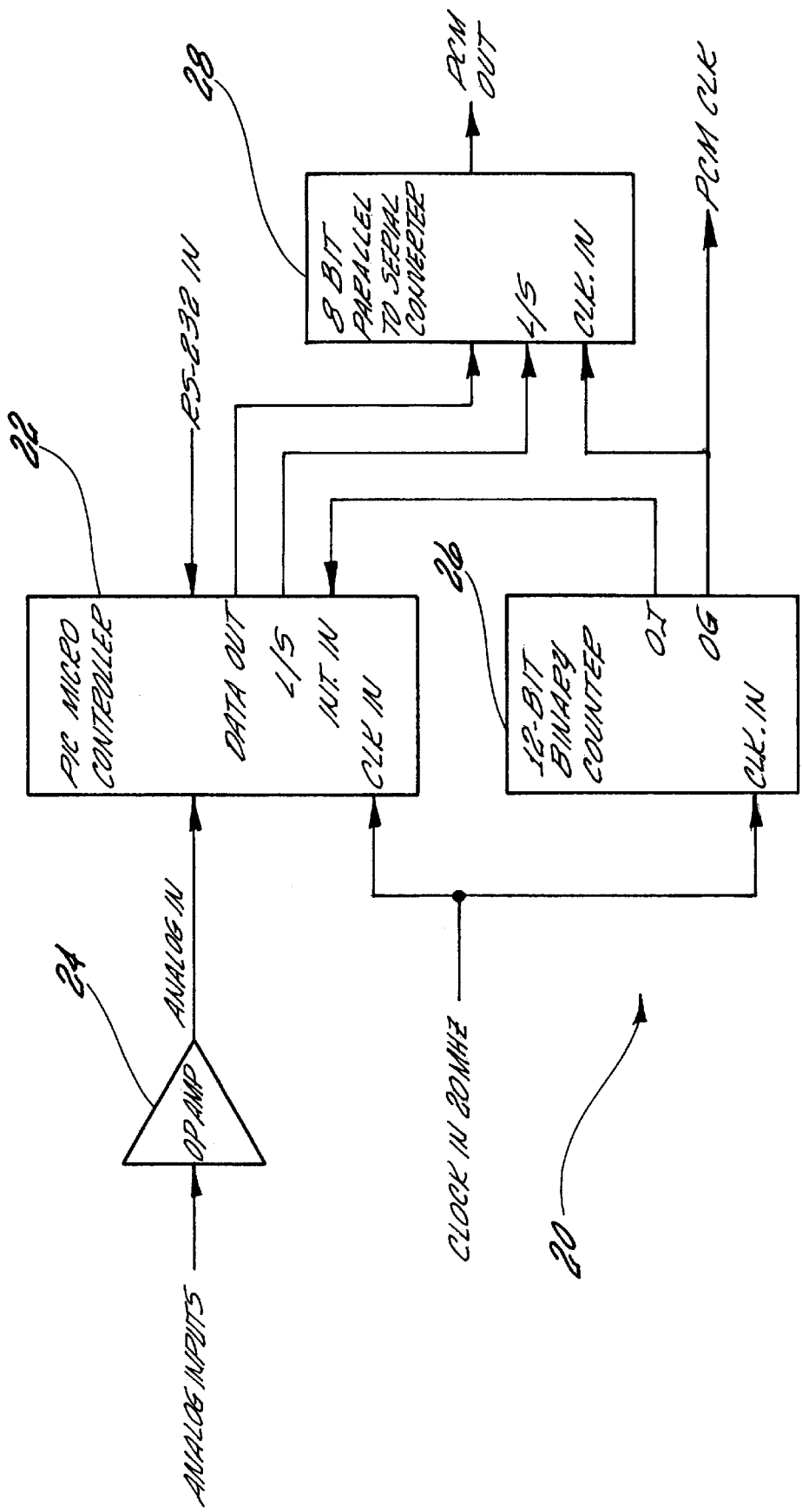
FIG. 1 is a generalized block diagram of a programmable microcontroller based PCM encoder according to the present invention.

As shown in FIG. 1, a PCM encoder 20 according to the present invention includes a microcontroller 22 formed to have a peripheral integrated controller (PIC) architecture, which is well-known in the art. An operational amplifier array 24 amplifies analog signals input thereto and provides a plurality of channels of ANALOG IN signals to a microcontroller 22. In a preferred embodiment of the invention there are ten channels of ANALOG IN signals. Microcontroller 22 preferably is a Microchip, Inc. device presently designated as PIC16C774QF or the equivalent.

Figure 6:
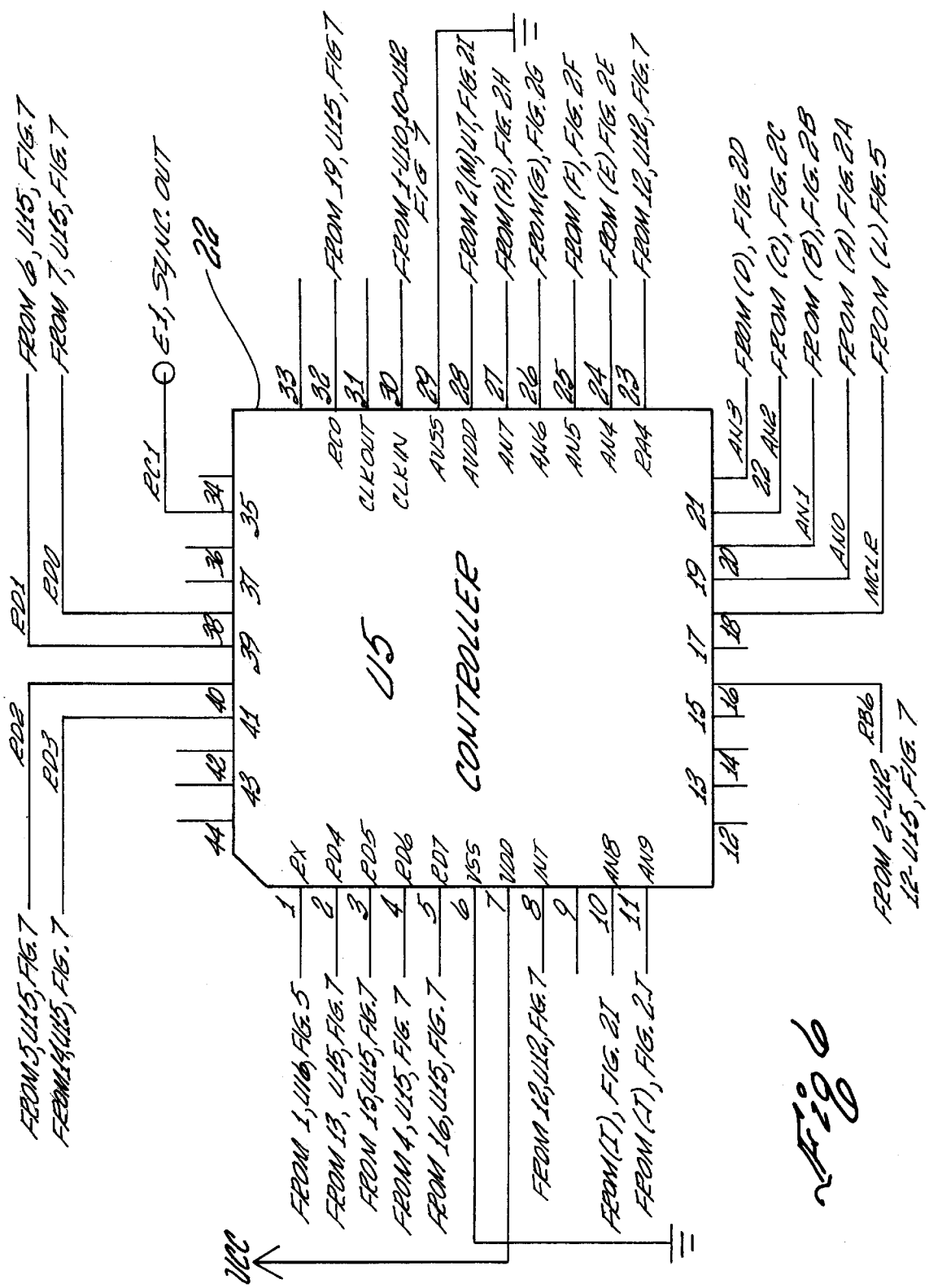
FIG. 6 illustrates a microcontroller that may be included in the embodiment of the invention shown in FIG. 1.

The preferred embodiment of microcontroller 22 is powerful, yet easy to program, having only thirty-five single word instructions. It is a reduced instruction set computer (RISC) based 8-bit microcontroller employing Microchip's PIC architecture into either a 40 or 44 pin package. As shown in FIG. 6 microcontroller 22 has pins numbered 1–44. Microcontroller 22 has ten channels of 12-bit A/D converter, which provides the capability of discriminating small signal changes and eliminating the need for high precision of analog signals. Microcontroller 22 is capable of receiving 40K samples of analog data per second with total throughput. As used in PCM encoder 20, microcontroller 22 performs A/D conversions, acquires digital RS-232 data and sets up the order for the data going into a shift register 28.

Microcontroller 22 also has an asynchronous serial data input channel that may be connected to a standard RS-422 receiver and receive signals having the standard RS-232 protocol (1 start bit, 8 data bits and 1 stop bit). RS-232 signals may be received at rates of up to 115.2 KBaud. Microcontroller 22 also preferably has on on-board first in/first out (FIFO) capability and can delay the entire data stream by up to 100 msec.

Microcontroller 22 receives CLOCK IN signals at a $CLK_{13}$ IN terminal. CLOCK IN signal are also input to a counter 26. In a preferred embodiment of the invention counter 26 is a 12-bit binary counter. Counter 26 has an output terminal OJ that is connected to an INT IN terminal of microcontroller and has an output OG that is connected to the CLK_IN terminal of shift register 28. Every time microcontroller 22 receives an interrupt signal at the INT IN terminal, it sends data from a DATA OUT terminal to shift register 28. Shift register 28 converts parallel data output from microcontroller 22 into a serial data stream output. A Load/Shift (L/S) terminal of microcontroller 22 is connected to an L/S terminal of shift register 28. After a data word in loaded into shift register 28, microcontroller 22 causes it to shift and prepare to receive the next data word.

In an exemplary embodiment of the invention microcontroller 22 is programmed to receive eight channels of analog signals (0 to 5V) at 3.551K samples/sec. Data is output at 312.5K bits/sec. The data output has 8 bits per word and 11 words per frame. There are 2 synch words and 1 frame counter word.

FIGS. 2A—2J show circuitry for a plurality of operational amplifiers 24A—24J that may be included in operational amplifier array 24. Operational amplifiers 24A–24J serve as buffers for analog signals that are input to microcontroller 22 Microcontroller 22 has ten analog input pins numbered 10, 11 and 19–27 in FIG. 6. Operational amplifiers 24A–24H are connected to microcontroller 22 at input pins 19–27, respectively; and operational amplifiers 24I and 24J are connected to microcontroller 22 at input pins 10 and 11, respectively. Operational amplifier array 22 provides analog signal conditioning with attenuation or gain on five channels and attenuation only on five channels. Suitable operational amplifiers are commercially available from several manufacturers. In an exemplary preferred embodiment of the invention, operational amplifiers 24A–24J are Burr-Brown model OPA2337 integrated circuits.

A resistor R6 having one grounded terminal is connected to the negative input of operational amplifier 24A. Resistor R6 preferably has a resistance of about 10MΩ. A resistor R8, preferably having a resistance of about 10Ω, is connected between the output of operational amplifier 24A and the negative input. An analog signal input passes through a resistor R9 that is connected to the positive input of operational amplifier 24A. Resistor R9 preferably has a resistance of about 100Ω. A capacitor C19, preferably having a capacitance of about 1500 pF is connected between the positive input of operational amplifier 24A and ground. A resistor R10 is connected in parallel with capacitor C19. Resistor R10 preferably has a resistance of about 150 kΩ.

Circuitry that is essentially identical to the circuitry connected to operational amplifier 24A is also connected to operational amplifiers 24C, 24E, 24G and 24I as shown in FIGS. 2C, 2E, 2G and 2I, respectively.

Operational amplifier 24B has its negative input terminal connected to its output terminal. An analog signal input passes through a resistor R14 that is connected to the positive input of operational amplifier 24A. Resistor R14 preferably has a resistance of about 100 kΩ. A capacitor C17, preferably having a capacitance of about 1500 pF is connected between the positive input of operational amplifier 24A and ground. A resistor R17 is connected in parallel with capacitor C19. Resistor R17 preferably has a resistance of about 150 kΩ.

Circuitry that is essentially identical to the circuitry connected to operational amplifier 24B is also connected to operational amplifiers 24D, 24F, 24H and 24J as shown in FIGS. 2D, 2F, 2H and 2J.

Referring to FIGS. 3 and 6, a voltage reference source 30 provides a reference voltage input to pin 28 of microcontroller 22 The reference voltage is applied to A/D converter circuitry (not shown) that is built into microcontroller 22. A suitable circuit for voltage reference source 30 is commercially available from Linear-Technology Corporation under model designation LT1460, which is a 2.5V-output, precision series, band gap reference that combines very high accuracy and low drift with low power dissipation. Any device that is equivalent to the Linear Technology LT1460 may be used as voltage reference source 30.

Figure 7:
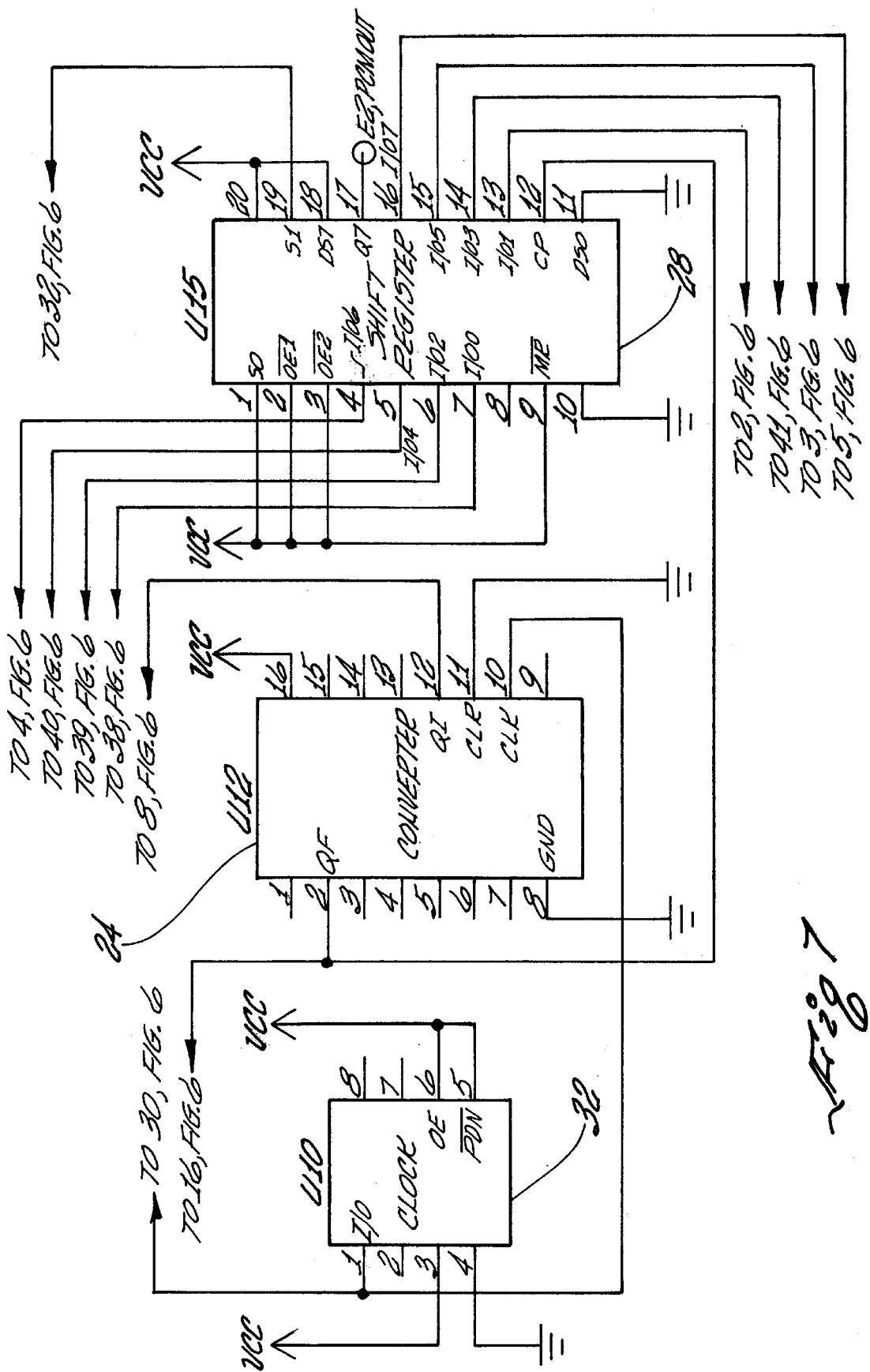
FIG. 7 illustrates a clock, a counter and a shift register that may be connected to the microcontroller of FIG. 6.

Referring to FIGS. 6 and 7, a clock circuit 32 provides clock (CLK) signals to pin 30 of microcontroller 22 and to pin 10 of counter 26. Clock circuit 32 preferably is a Dallas Semiconductor's DS 1075 or the equivalent. The DS1075 can be programmed to produce a set frequency between 27 kHz and 100 MHz. In the present invention, clock circuit 32 is programmed to have an output frequency of 20 MHz. The DS 1075 includes a programmable EEPROM divider and a prescaler (not shown) that is used to produce the desired output frequency.

Counter 26 has a pin 12 that is connected to pin 8 of microcontroller 22 Counter 26 preferably is an SGS-Thomson Microelectronics high speed CMOS 74HC4040 twelve-stage binary counter. Each division stage has an output with the final frequency output being $$\frac{1}{4096} f_{IN}$$

where $f_{IN}$ is the frequency of the signal input from clock circuit 32. Counter 26 divides the clock signal down to a word clock signal and a bit clock signal that are input to microcontroller 22.

Still referring to FIGS. 6 and 7, shift register 28 has a pin 12 that is connected to pin 2 of counter 26, which is also connected to pin 8 of microcontroller 22 Shift register 28 has pins 4–8 and 9 that are connected to pins 4, 40, 39, 38 and 8, respectively, of microcontroller 22 Pins 12–16 of shift register 28 are connected to pins 2, 41, 3 and 5, respectively, of microcontroller 22 A signal output is provided at pin 17 of shift register 28.

As shown in FIG. 9, PCM encoder 20 includes a voltage regulator 34 that provides a regulated voltage Vcc to various components of the PCM encoder 20. Voltage regulator 34 may be a Linear Technologies model LT1121, which is a micropower low dropout regulator capable of supplying 150 mA of output current with a dropout voltage of 0.4V. The Linear Technologies model LT1 121 has the ability to operate with very small output capacitors. In the present invention voltage regulator 34 has an output capacitor C25 that is preferably about 1.0 µF. A plurality of grounded capacitors C1, C7, C9–C12, C16, C18, C20, C21 and C23 are arranged in parallel and connected to pin 1 of voltage regulator 34 to by-pass digital logic signals and to provide noise reduction.

As shown in FIG. 4, PCM encoder 20 receives signals from a line receiver 40 that preferably is a Linear Technologies model LTC1482 integrated circuit or the equivalent. Line receiver 40 receives a balanced signal input that may be in standard RS422 or RS485 format and provides a unipolar output that is either zero or five volts to microcontroller 22 Signals output from pin 1 of line receiver 38 are input to pin 1 of microcontroller 22 as indicated in FIGS. 4 and 6.

Shift register 28 preferably is an 8-bit universal shift/ storage register sold by Fairchild Semiconductor as model No. 74AC299. Any equivalent device may be used in practicing the invention. Four modes of operation are possible: hold (store), shift left, shift right and load data. The parallel load inputs and flip-flop outputs are multiplexed to reduce the total number of package pins. A separate active LOW Master Reset is used to reset the register. Shift register 28 is arranged to receive control signals and data signals from microcontroller 22 Signals output from shift register 28 are input to a buffer circuit 36, which may be a Phillips Semiconductors model 74AHC1G08 integrated circuit. Signals output from the buffer 36 pass through a resistor R11 and filtered by a pi-filter circuit 38 that includes an inductor L1 between two grounded capacitors C2 and C3. Signals passed by the pi-filter 38 comprise the output of the PCM encoder 20 and are the voltage across a resistor R17.

Software that may be used to program microcontroller 22 and control the interrupt and shifting circuits is presented in an appendix. The software includes four sections:

1. Initialization,
2. interrupt service,
3. a main "frame," and
4. individual word routines.

The initialization section sets up internal registers, inputs/outputs (I/O's), interrupts, peripheral functions of microcontroller 22 and default variable words.

The interrupt service routine places the next PCM data word on an output port, controls the L/S input of shift register 28 and resets the WAITING for interrupt flag.

The main "frame" is an endless loop used to acquire each progressive PCM data word from either internal registers in microcontroller 22 or from its peripherals. Each word output from microcontroller 22 is sequenced in a progressive order via a lookup table. Microcontroller 22 uses a function called "ADDWF PCL, 1" that adds the contents of a register W to the program counter. Register W had previously been loaded with a variable called CURRENT_WORD, which is a number that is incremented each time a PCM word is placed on the output port and then reset to zero after the entire PCM frame has been sequenced through.

Each time the ADDWF command is executed, it jumps to the next GOTO statement. Each GOTO statement then goes to the routine listed to execute the routine for that PCM word. After the routine is executed, it places the acquired data in a WORD_BUFFER register, sets a WAITING variable and then returns to the main routine. The main routine then waits in a loop for the next interrupt request.

The individual routines include code necessary to acquire data from the A/D converter, ASART, counters and preset synchronization patterns.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

Appendix

```
;****************************************************************
;                              *
;   Filename:     TTFT_TM.asm              *
5  ;   Date:         4/06/2001                *
;   File Version: Ver 3.01                *
;                              *
;   Author:       Gary Borgen              *
;   Company:      NAWCWD                        *
10 ;                          *;
;
;****************************************************************
***
;
15 *
;   Files required:      None
*
;
*
20 ;
*
;
;****************************************************************
****
```

NC83071

```
    ;
    *
    ;       Notes:      Program samples five analog channels and the serial        *
    ;                   port (115.2 K baud) and constructs a PCM frame.            *
5   ;                   NRZL is shifted out of an external shift register at 312.5 K
    b/s     *
    ;                   Using RB0 as an external interrupt input to keep the
    *
    ;                   parallel to serial shift register full and clocking         *
10  *
    ;       Rev 2.01 -  Works at 57.6 K baud with no framing errors.                *
            2/23/01                                                                 *
    ;       Rev 2.10 -  Converted hc166 to a more available ac299                   *
    ;                   requires the inversion of the shift/load line  *
15  ;                   2/27/01                        *
    ;       Rev 2.11 -  Modified org statements to maximize pcm frame               *
    ;                   size capacity and cleaned up comments         *
    ;                   3/1/01                         *
    ;       Rev 3.0 -   Modified A/D routine to acquire data from previous          *
20  ;                   conversion and start conversion on the named channel.       *
    ;                   Also modified initialization routine to accept defined      *
    ;                   values for number of channels and baud rate.*
    ;                   4/6/01                         *
    ;       Rev 3.01 -  Changed location in routine that A/D channel is             *
```

−13−

NC83071

```
        ;           selected in an attempt to maximize settling time.        *
        ;           4/9/01                    *
        ;      Rev 3.1 -  Found error in breadboard.  Now works at           *
        ;           115.2 K baud with no errors. *
5       ;           4/17/01                   *
        ;      Rev 4.0 -  Implemented control of external FIFO for delay.    *
        ;           9/10/01                   *
        ;                                     *
        ;****************************************************************
10      ****
``` list    p=16c774        ; list directive to define processor include <p16c774.inc>    ; processor specific variable definitions

__CONFIG    _CP_OFF &  _WDT_OFF &  _BODEN_OFF & _PWRTE_ON & _HS_OSC & _VBOR_42

15 ; '__CONFIG' directive is used to embed configuration data within .asm file.

; _CP_OFF = Program code protection off

; _WDT_OFF = Watchdog Timer disabled

; _BODEN_OFF = Brown-out Reset disabled

; _PWRTE_ON = Power-up Timer enabled

20 ; _HS_OSC = High Speed external oscillator selected

; _VBOR_42 = Brown-out Reset Voltage set to 4.2V

;***** VARIABLE DEFINITIONS

CURRENT_WORD EQU 0x30        ; NEXT WORD TO BE SHIFTED OUT THROUGH SERIAL PORT

-14-

NC83071

```
    ANALOG_CHANNEL   EQU  0x31      ;  NEXT  ANALOG
    CHANNEL TO CONVERT
    FRAME_COUNTER EQU  0x32      ; FRAME  COUNTER  REGISTER
    LOCATION
5   WAITING?  EQU  0x33  ; FLAG  REGISTER  1  IF  WAITING  FOR
    INTERRUPT
                     ;    0 IF INTERRUPT COMPLETE, PROCESS NEXT
    WORD
    WORD_BUFFER   EQU   0x34       ;  NEXT   WORD   FOR   THE
10  MASTER SERIAL OUTPUT PORT
    TEMP_NIB   EQU   0x35       ;  NIBBLE  BUFFER  FOR  12  BIT
    TRANSFERS
    TEMP_SER   EQU   0x36          ; TEMPORARY SERIAL BUFFER
    TEMP_STAT EQU   0x37          ; TEMPORARY SERIAL STATUS
15  FIRST_WORD?    EQU   0x38        ; FIRST WORD INDICATOR FOR
    TIME DELAY SYNCRONATION
    w_temp       EQU    0x70       ; variable used for context saving
    status_temp  EQU    0x71       ; variable used for context saving
    #DEFINE    SYNC_1_8 B'11101011'   ; IRIG 106 16 bit sync word first
20  byte
    #DEFINE    SYNC_2_8 B'10010000'   ; IRIG 106 16 bit sync word second
    byte
    #DEFINE    SYNC_1_12 B'11111010'  ; IRIG 106 24 bit sync word first
    byte
```

-15-

NC83071

```
     #DEFINE   SYNC_2_12 B'11110011'   ; IRIG 106 24 bit sync word second
     byte
     #DEFINE   SYNC_3_12 B'00100000'   ; IRIG 106 24 bir sync word third
     byte
5    ;#DEFINE  AD_INPUT B'00001111'    ; A/D RESULT LEFT JUSTIFIED,
     VrefH=AVDD
                                       ; VrefL=AVSS, NO AN'S SELECTED AS
     ANALOG
                                       ; INPUTS - 0 CHANNELS
10   ;#DEFINE  AD_INPUT B'00001110'    ; A/D RESULT LEFT JUSTIFIED,
     VrefH=AVDD
                                       ; VrefL=AVSS, AN0 SELECTED AS ANALOG
                                       ; INPUT - 1 CHANNEL
     ;#DEFINE  AD_INPUT B'00001101'    ; A/D RESULT LEFT JUSTIFIED,
15   VrefH=AVDD
                                       ; VrefL=AVSS, AN0 - AN1 SELECTED AS
     ANALOG
                                       ; INPUTS - 2 CHANNELS
     ;#DEFINE  AD_INPUT B'00001100'    ; A/D RESULT LEFT JUSTIFIED,
20   VrefH=AVDD
                                       ; VrefL=AVSS, AN0 - AN2 SELECTED AS
     ANALOG
                                       ; INPUTS - 3 CHANNELS
```

—16—

NC83071

```
        #DEFINE     AD_INPUT B'00001011'   ; A/D RESULT LEFT JUSTIFIED, VrefH=AVDD
                                           ; VrefL=AVSS, AN0 - AN3 SELECTED AS ANALOG
5                                          ; INPUTS - 4 CHANNELS
        ;#DEFINE    AD_INPUT B'00001010'   ; A/D RESULT LEFT JUSTIFIED, VrefH=AVDD
                                           ; VrefL=AVSS, AN0 - AN4 SELECTED AS ANALOG
10                                         ; INPUTS - 5 CHANNELS
        ;#DEFINE    AD_INPUT B'00001001'   ; A/D RESULT LEFT JUSTIFIED, VrefH=AVDD
                                           ; VrefL=AVSS, AN0 - AN5 SELECTED AS ANALOG
15                                         ; INPUTS - 6 CHANNELS
        ;#DEFINE    AD_INPUT B'00001000'   ; A/D RESULT LEFT JUSTIFIED, VrefH=AVDD
                                           ; VrefL=AVSS, AN0 - AN6 SELECTED AS ANALOG
20                                         ; INPUTS - 7 CHANNELS
        ;#DEFINE    AD_INPUT B'00000111'   ; A/D RESULT LEFT JUSTIFIED, VrefH=AVDD
                                           ; VrefL=AVSS, AN0 - AN7 SELECTED AS ANALOG
```

NC83071

```
                        ; INPUTS - 8 CHANNELS
;#DEFINE    AD_INPUT B'00000110'   ; A/D RESULT LEFT JUSTIFIED,
VrefH=AVDD
                        ; VrefL=AVSS, AN0 - AN8 SELECTED AS
ANALOG
                        ; INPUTS - 9 CHANNELS
;#DEFINE    AD_INPUT B'00000101'   ; A/D RESULT LEFT JUSTIFIED,
VrefH=AVDD
                        ; VrefL=AVSS, AN0 - AN9 SELECTED AS
ANALOG
                        ; INPUTS - 10 CHANNELS ;#DEFINE    BAUD_RATE D'129'; SET USART BAUD RATE VALUE
Fosc/(16(X+1))
                        ;   20 MHz/(16(129+1)) = 9.615 Kbaud (9600)
;#DEFINE    BAUD_RATE D'64'     ; SET USART BAUD RATE
VALUE Fosc/(16(X+1))
                        ;   20 MHz/(16(64+1)) = 19.230 Kbaud
(19200)
;#DEFINE    BAUD_RATE D'32'     ; SET USART BAUD RATE
VALUE Fosc/(16(X+1))
                        ;   20 MHz/(16(32+1)) = 37.818 Kbaud
(38400)
```

NC83071

```
    ;#DEFINE  BAUD_RATE D'21'      ; SET USART BAUD RATE VALUE Fosc/(16(X+1))
                                    ; 20 MHz/(16(21+1)) = 56.818 Kbaud (57600)
5   #DEFINE   BAUD_RATE D'10'      ; SET USART BAUD RATE VALUE Fosc/(16(X+1))
                                    ; 20 MHz/(16(10+1)) = 113.636 Kbaud (115200)
    #DEFINE   DELAY_COUNT B'00010000'  ; DELAY COUNTER VALUE
10
                                    ; SET TO 255 FOR NO DELAY, 0 FOR 104.8576 msec DELAY
    ;***************************************************************
15            ORG    0x000         ; processor reset vector
              clrf   PCLATH        ; ensure page bits are cleared
              goto   INITIALIZE    ; go to beginning of program 20                                 ; EXTERNAL INTERRUPT RB0
              ORG    0x004         ; interrupt vector location
              movwf  w_temp        ; save off current W register contents
              movf   STATUS,w      ; move status register into W register
              movwf  status_temp   ; save off contents of STATUS register
```

−19−

NC83071

```
            BCF   STATUS, RP0    ; SELECT BANK 0
            MOVF  WORD_BUFFER, W ; GET WORD TO BE SHIFTED OUT
5           MOVWF PORTD          ; PUT IT ON PORTD
            BSF   PORTC, 0       ; BRING SHIFT/LOAD HIGH (AC299 S1)
                                 ;
            NOP                  ; WAIT FOR 16 INSTRUCTION CYCLES (64 CLOCKS)
10          NOP                  ; TO INSURE THAT THE SHIFT CLOCK
            NOP                  ; GOING TO THE AC299 HAS
            NOP                  ; TRANSITIONED FROM LOW TO HIGH
            NOP                  ; ONCE TO LOAD PORTD DATA INTO
            NOP                  ; THE SYCHRONOUS SHIFT REGISTER
15          NOP                  ;
            NOP
            NOP
            NOP
            NOP
20          NOP
            NOP
            NOP
            NOP
            BCF   PORTC, 0       ; BRING THE SHIFT/LOAD LINE LOW
```

−20−

NC83071

```
                BCF    INTCON,1   ; RESET RB0 INTERRUPT
                BCF    WAITING?,0 ; CLEAR WAITING FOR INTERRUPT
      FLAG 5               movf   status_temp,w  ; retrieve copy of STATUS register
                movwf  STATUS         ; restore pre-isr STATUS register contents
                swapf  w_temp,f
                swapf  w_temp,w       ; restore pre-isr W register contents
                retfie                ; return from interrupt
10              ORG    0x100          ; Program memory page 0
      INITIALIZE CLRF STATUS          ; CLEAR THE STATUS
      REGISTER, SELECT BANK 0
                MOVLW  B'00000000'    ; SET ALL INTERRUPTS TO
      DISABLE
15              MOVWF  INTCON         ; SET REGISTER
                CLRF   PORTA          ; CLEAR PORT A
                CLRF   PORTB          ; CLEAR PORT B
                CLRF   PORTC          ; CLEAR PORT C
                CLRF   PORTD          ; CLEAR PORT D
20              CLRF   PORTE          ; CLEAR PORT E
                BSF    STATUS, RP0    ; SELECT BANK 1
                MOVLW  0xFF           ; SET ALL OF PORTA TO INPUTS
                MOVWF  TRISA          ; SET THE PORT
                MOVLW  0xFF           ; SET ALL OF PORTB TO INPUTS
```

-21-

NC83071

```
                                ; USING RB0 AS AN INTERRUPT INPUT
            MOVWF    TRISB      ; SET THE PORT
            MOVLW    B'11000000' ; SET PORTC TO: 7-USART
    ASYNC RECEIVE, 6-USART ASYNC XMT(YES AN INPUT),
5                    ;  5-RC5 OUTPUT, 4-RC4 OUTPUT, 3-RC3 OUTPUT
                     ;  2-RC2 OUTPUT, 1-RC1 OUTPUT, 0-RC0 OUTPUT
                     ;  RC0 IS THE SHIFT/LOAD SIGNAL TO THE SHIFT REG
10
                            ;   RC1 IS THE SYNC OUT SIGNAL
                            ;   RC2 IS FIFO READ
                            ;   RC3 IS FIFO WRITE
                            ;   RC4 IS FIFO RESET
15                          ;   RC5 IS FIFO OUTPUT ENABLE
            MOVWF    TRISC       ; SET THE PORT
                                 ; INITIALIZE THE EXTERNAL FIFO
            BCF   STATUS,RP0 ; SELECT BANK 0
            BSF   PORTC,5       ; DISABLE FIFO OUTPUT ENABLE
20
            BSF   PORTC,2    ; SET FIFO READ HIGH - DISABLE READS
            BSF   PORTC,3    ; SET FIFO WRITE HIGH - DISABLE WRITES
```

–22–

NC83071

```
            BCF    PORTC,4    ; SET FIFO RESET LOW (ACTIVE) -
RESET FIFO
            BSF    PORTC,4              ; SET FIFO RESET HIGH -
ENABLE FIFO
5                                       ; WAIT FOR FIRST WORD
(SYNC1) BEFORE ENABLING WRITES
                                        ; WAIT FOR TIMER0 OVERFLOW
BEFORE ENABLING READS
            BCF    PORTC,5              ; ENABLE FIFO OUTPUT FOR
10  NOW
                                 ;
            BSF    STATUS, RP0          ; SELECT BANK 1
            MOVLW  0x00                 ; SET ALL OF PORTD TO
OUTPUTS
15          MOVWF  TRISD                ; SET THE PORT
            MOVLW  0x07                 ; SET PORT E TO ALL ANALOG
INPUTS
            MOVWF  TRISE                ; SET THE PORT
            MOVLW  B'00000000'          ; SET VOLTAGE REFERENCE
20  REG
                           ;    7-VRHEN OFF, 6-VRLEN OFF, 5-4-
DISABLED INTERNAL
                           ;    USE ONLY, 3-0-XX
            MOVWF  REFCON               ; WRITE OUT SETTING
```

-23-

NC83071

```
         BCF   STATUS, RP0    ; SELECT BANK 0
         MOVLW   B'10000001'  ; A/D CONVERSION CLOCK SET
   TO Fosc/32,
                              ; CHANNEL 00 (AN0) SELECTED,
 5  CONVERSION NOT
                              ; IN PROCESS, A/D CONVERTER ON
         MOVWF   ADCON0       ; WRITE OUT SETTING
         BSF   STATUS, RP0    ; SELECT BANK 1
         MOVLW   AD_INPUT     ; A/D SETUP RESULT LEFT
10  JUSTIFIED, VrefH=AVDD
                              ; VrefL=AVSS, NUMBER OF ANALOG INPUTS
   SELECTED
                              ; BY AD_INPUT DEFINE
         MOVWF   ADCON1       ; WRITE OUT SETTINGS
15       BCF   STATUS, RP0    ; SELECT BANK 0
         MOVLW   B'00010010'  ; SET SYNC SERIAL PORT
   REGISTER TO: 7,6-XX
                              ; 5-DISABLE SPI, 4-CKP=CLOCK POLARITY IDLE
   HIGH
20                            ; 3-0-SPI MASTER MODE, CLOCK
   Fosc/64
         MOVWF   SSPCON       ; SET REGISTER
         BSF   STATUS, RP0    ; SELECT BANK 1
```

–24–

NC83071

```
          MOVLW    B'01000000'  ; SET SYNC SERIAL PORT STATUS REGISTER TO:
                            ;    7-INPUT SAMPLED MID DATA OUT, 6-CKE=DATA XMT FALLING
                            ;    EDGE OF SCK, 5-0-XX
          MOVWF    SSPSTAT      ; SET REGISTER
          MOVLW    B'00000100'  ; SET USART XMT CONTROL REGISTER TO:
                            ;    7-X, 6-8-BIT, 5-TRANSMIT DISABLED,
                            ;    4-ASYNCH MODE, 3-X, 2-HIGH SPEED, 1-0-XX
          MOVWF    TXSTA        ; SET REGISTER
          BCF   STATUS, RP0     ; SELECT BANK 0
          MOVLW    B'10010000'  ; SET USART RECV CONTROL REGISTER TO:
                            ;    7-SERIAL PORT ENABLED, 6-8-BIT, 5-X,
                            ;    4-CONTINUOUS RECEIVE, 3-NO ADDRESS DETECT, 2-0-XX
          MOVWF    RCSTA        ; SET REGISTER
          BSF   STATUS, RP0     ; SELECT BANK 1
          MOVLW    BAUD_RATE    ; SET USART BAUD RATE VALUE Fosc/(16(X+1))
                            ;    20 MHz/(16(X+1)) = SEE DEFINE
          MOVWF    SPBRG        ; SET REGISTER
```

-25-

NC83071

```
           MOVLW    0x00          ; SET ALL PERIPHERAL
INTERRUPTS TO DISABLE
           MOVWF    PIE1          ; REGISTER 1
           MOVWF    PIE2          ; REGISTER 2
 5         BCF  STATUS, RP0       ; SELECT BANK 0
                                  ;
           MOVLW    D'0'          ; SET CURRENT_WORD IN
FRAME TO 0
           MOVWF    CURRENT_WORD  ; SET REGISTER
10                                ;
           BSF  FIRST_WORD?,0     ; SET THE FIRST WORD FLAG
TO SYNCHRONIZE THE DELAY
                                  ;
           MOVLW    B'10101000'   ; SETUP TEMPORARY SERIAL
15 STATUS WORD
           MOVWF    TEMP_STAT     ; SET IT TO NO ERRORS, OLD
DATA
           MOVLW    B'11110000'   ; SETUP TEMPORARY SERIAL
DATA REGISTER
20         MOVWF    TEMP_SER      ; JUST TO INSURE TRANSITIONS
           BSF  STATUS, RP0       ; SELECT BANK 1
           MOVLW    B'01110011'   ; SETUP OPTION REGISTER FOR
RB0 INTERRUPT
```

NC83071

```
                              ;   7-PORTB PULL-UPS ENABLED,
       6-INTERRUPT ON RISING EDGE OF RB0
                              ;   5-TMR0   CLOCK    SOURCE
       EXTERNAL RA4, 4-INCREMENT ON HIGH TO LOW RA4
5                             ;   3-PRESCALER ASSIGNED TO
       TMR0, 2-0-PRESCALE 1:16
              MOVWF    OPTION_REG    ; SET REGISTER
              BCF   STATUS, RP0    ; SELECT BANK 0
              BSF   ADCON0, 2  ; START A/D CONVERSION TO START
10     A/D PROCESS (CLEAR LOOP ERROR)
              MOVLW    0x00       ; SET FRAME COUNTER TO
       ZERO
              MOVWF    FRAME_COUNTER ; SET THE REGISTER
                                  ;
15            BCF  WAITING?,0 ;  SET  WAITING?  FLAG  TO  NOT
       WAITING FOR INTERRUPT
                                  ; BECAUSE WE WANT TO GET FIRST
       DATA BYTE READY FOR
                                  ; SHIFTING OUT
20                                ;
              MOVLW    B'00010000' ;  SET  INTCON  REGISTER
       SETTINGS
                              ;   7-DISABLES ALL INTERRUPTS
       FOR NOW, 6-NO PEIE, 5-NO TMR0
```

–27–

NC83071

```
                         ;    4-IINTE(RB0)    INTERRUPT ENABLED, 3-NO RBIE, 2-CLEAR TMRO
                         ;    1-CLEAR INTF (RB0), 0-CLEAR RBIF
5                        ;    INTERRUPTS NOT ENABLED UNTIL FIRST WORD IS SETUP IN
                         ;    WORD_BUFFER REGISTER
         MOVWF    INTCON     ; SET REGISTER
         GOTO MAIN        ;    END INITILIZATION - BEGIN PROGRAM
10
                         ;
                         ;
                         ;
         ORG   0x030     ; MAIN PROGRAM
15  MAIN   BTFSC     WAITING?,0  ; TEST TO SEE IF WAITING FOR AN INTERRUPT
         GOTO MAIN         ; YES STILL WAITING LOOP BACK TO MAIN
         MOVFCURRENT_WORD,W    ; OTHERWISE, MOVE THE CURRENT_WORD DATA TO W
20
         ADDWF    PCL,1      ; ADD W WITH THE PROGRAM COUNTER PUT BACK IN PCL
                         ;
```

-28-

NC83071

```
                        ; PROGRAM WILL INCREMENT THROUGH THE FOLLOWING
                        ; ROUTINES ONE AT A TIME
                        ; THEN RESET THE CURRENT_WORD REGISTER
                        ; AND START ALL OVER
                        ;
                        ; THE MAIN PCM FRAME MAY HAVE UPTO 213 WORDS IN LINEAR ORDER
                        ; SUBFRAMES ARE POSSIBLE WITH THE USE OF ADDITIONAL
                        ; FLAGS AND COUNTERS
                        ;
                        ; NOTE: THE "JUMP TABLE" MUST BE IN THE FIRST
                        ; 255 WORDS IN MEMORY TO WORK BECAUSE IT IS ONLY
                        ; POSSIBLE TO ALTER THE LOWER 8 BITS OF THE PROGRAM
                        ; COUNTER WITH THE "ADDWF PCL,1"
                        ;
                        ; PUT FRAME FORMAT IN DESIRED ORDER HERE
                        ; SYNTAX: GOTO (DESIRED WORD)
```

−29−

NC83071

```
              GOTO    SYNC1          ;
              GOTO    SYNC2          ;
              GOTO F_COUNT           ;
              GOTO ANALOG2           ; ACTUALLY READS ANALOG1
      AND SETS UP ANALOG2
              GOTO ANALOG3           ; ACTUALLY READS ANALOG2
      AND SETS UP ANALOG3
              GOTO ANALOG4           ; ACTUALLY READS ANALOG3
      AND SETS UP ANALOG4
              GOTO ANALOG1           ; ACTUALLY READS ANALOG4
      AND SETS UP ANALOG1
                                     ; END FRAME FORMAT
                                     ;
              BSF   PORTC, 1         ; SET BIT 1 ON PORTC - FRAME SYNC
      FLAG HIGH
              MOVLW    D'0'          ; SET CURRENT_WORD IN
      FRAME TO 0
              MOVWF   CURRENT_WORD   ; SET REGISTER
              BCF   PORTC, 1         ; CLEAR BIT 1 ON PORTC - FRAME
      SYNC FLAG LOW
              GOTO MAIN
              ORG   0x200            ; BELOW ARE THE ROUTINES FOR
      THE INDIVIDUAL PCM WORDS
                                     ;
```

–30–

NC83071

```
                        ; SYNC WORD 1
                        ;
SYNC1       BCF   STATUS, RP0    ; SELECT BANK 0
            MOVLW SYNC_1_8 ; LOAD SYNC_1 INTO THE WORD_BUFFER
            MOVWF WORD_BUFFER ;
            INCF  CURRENT_WORD,W  ; INCREMENT THE CURRENT WORD
            MOVWF CURRENT_WORD ;
            BSF   WAITING?,0 ; SET WAITING FOR INTERRUPT FLAG
                        ;
            BTFSS FIRST_WORD?,0  ; IS THIS THE FIRST WORD? YES, SKIP NEXT IF SET
            GOTO  NOT_FIRST ; OTHERWISE BYPASS FIFO, DELAY AND INTERRUPT SETUP
                        ;
            BCF   PORTC,3        ; SET FIFO WRITE LOW - ENABLE WRITES
            BCF   FIRST_WORD?,0  ; CLEAR FIRST WORD FLAG
            MOVLW DELAY_COUNT    ; GET SELECTED DELAY COUNT FOR TMR0 SEED
            MOVWF TMR0           ; SEED THE DELAY TIMER - WILL COUNT FROM SEED VALUE
```

-31-

NC83071

```
                            ; TO FFh, THEN ON RESET TO ZERO,
        WILL SET THE T0IF IN INTCON
                MOVLW   B'10010000'  ; ENABLE ALL INTERRUPTS, 4-
        IINTE(RB0) INTERRUPT ENABLED
5                                ;       1-CLEAR INTF (RB0)
                                 ; WAITED UNTIL NOW TO ENABLE
        INTERRUPTS TO MINIMIZE
                                 ; THE POSIBILITY OF AN INTERRUPT
        OCCURING BEFORE THE FIRST
10                               ; WORD COULD BE SETUP IN THE
        WORD_BUFFER REGISTER
                MOVWF   INTCON           ; SET REGISTER
                                 ;
        NOT_FIRST BTFSS INTCON,T0IF     ; HAS THE TMR0 REGISTER
15      OVERFLOWED? YES, SKIP NEXT IF SET
                GOTO    MAIN            ; NO OVERFLOW GOTO MAIN
                BCF   PORTC,2            ; SET FIFO READ LOW - ENABLE
        READS
                BCF   INTCON,T0IF        ; CLEAR INTERRUPT, DON'T
20      REALLY NEED TO BUT... FOR REPEAT?
                GOTO MAIN         ; RETURN TO MAIN
                                  ; SYNC WORD 2
                                  ;
        SYNC2       BCF  STATUS, RP0     ; SELECT BANK 0
```

-32-

NC83071

```
              MOVLW    SYNC_2_8  ; LOAD SYNC_2 INTO THE WORD BUFFER
              MOVWF    WORD_BUFFER
              INCF CURRENT_WORD,W   ;   INCREMENT THE CURRENT WORD
              MOVWF    CURRENT_WORD
              BSF   WAITING?,0 ; SET WAITING FOR INTERRUPT FLAG
              GOTO     MAIN
                               ; SERIAL UART INPUT STATUS WORD
                               ;
    D_STAT1   BCF    STATUS, RP0    ; SELECT BANK 0
              BTFSC    PIR1,5    ; TEST TO SEE IF RECIEVE BUFFER IS FULL
              GOTO CHECK_F_ERROR ; YES, GET SERIAL DATA AND STATUS
              BCF   TEMP_STAT,0   ; OTHER WISE MARK STATUS WORD AS OLD DATA
              GOTO DUMP_IT      ; DUMP
    CHECK_F_ERROR BTFSC    RCSTA,2         ; TEST FOR FRAMING ERROR - SKIP NEXT IF NO (0)
              GOTO SET_F_ERROR   ;
              BCF   TEMP_STAT,2   ; NO FRAMING ERROR, CLEAR BIT
              GOTO GET_S_DATA    ;
```

−33−

NC83071

```
        SET_F_ERROR   BSF   TEMP_STAT,2    ; YES FRAMING ERROR, SET BIT
        GET_S_DATA    MOVF RCREG,W         ; GET SERIAL WORD
                      MOVWF TEMP_SER       ; MOVE IT INTO TEMPORARY
 5                                           SERIAL BUFFER
                      BSF   TEMP_STAT,0    ; SET NEW DATA FLAG
        CHECK_O_RUN   BTFSC RCSTA,1        ; TEST FOR OVERRUN ERROR - SKIP NEXT IF NO (0)
                      GOTO SET_O_RUN       ;
10                    BCF   TEMP_STAT,1    ; NO OVERRUN ERROR, CLEAR BIT
                      GOTO DUMP_IT         :
        SET_O_RUN BSF TEMP_STAT,1          ; YES OVERRUN ERROR, SET BIT
15                    BCF   RCSTA, 4       ; DISABLE CONTINUOS RECEIVE TO CLEAR OVERRUN
                      BSF   RCSTA, 4       ; RE-ENABLE CONTINUOS RECEIVE
        DUMP_IT       MOVF TEMP_STAT,W     ; GET STATUS WORD
                      MOVWF WORD_BUFFER    ; PUT IT IN WORD
20                                           BUFFER
                      INCF  CURRENT_WORD,W ; INCREMENT THE CURRENT WORD
                      MOVWF CURRENT_WORD   ; STORE IT
                      BSF   WAITING?,0     ; SET WAITING FOR INTERRUPT FLAG
```

−34−

NC83071

```
                GOTO    MAIN
                                ; SERIAL UART INPUT DATA WORD
                                ; NOTE: SERIAL UART INPUT STATUS WORD MUST PRECCED THIS WORD
5                               ;
        D_DATA1         BCF     STATUS, RP0     ; SELECT BANK 0
                        MOVF    TEMP_SER,W      ; GET TEMPORARY SERIAL BUFFER DATA
                        MOVWF   WORD_BUFFER     ; PUT IT IN WORD BUFFER
10
                        INCF    CURRENT_WORD,W  ; INCREMENT CURRENT WORD
                        MOVWF   CURRENT_WORD    ; STORE IT
                        BSF     WAITING?,0      ; SET WAITING FOR INTERRUPT FLAG
15                      GOTO    MAIN
                                ; FRAME COUNTER WORD
                                ; NOTE: WORD IS INCREMENTED AFTER IT IS READ
                                ;
20      F_COUNT         BCF     STATUS, RP0     ; SELECT BANK 0
                        MOVF    FRAME_COUNTER,W ; GET FRAME COUNTER WORD
                        MOVWF   WORD_BUFFER     ; PUT IT IN WORD BUFFER
```

–35–

NC83071

```
            INCF  FRAME_COUNTER,W    ;  INCREMENT  THE FRAME COUNTER WORD
            MOVWF  FRAME_COUNTER ; STORE IT AWAY
            INCF  CURRENT_WORD,W    ; INCREMENT  CURRENT WORD
            MOVWF  CURRENT_WORD  ; STORE IT
            BSF  WAITING?,0 ; SET WAITING FOR INTERRUPT FLAG
            GOTO  MAIN
                            ;  READ  PREVIOUS  ANALOG CONVERSION
                            ; ANALOG CHANNEL 1 IS SELECTED FOR CONVERSION
                            ; AND CONVERSION IS STARTED
                            ;
ANALOG1     BCF  STATUS, RP0    ; SELECT PAGE 0
            MOVLW  B'10000001'  ; A/D CONVERSION CLOCK SET TO Fosc/32,
                            ;  CHANNEL  1  (AN0)  SELECTED, CONVERSION NOT
                            ; IN PROCESS, A/D CONVERTER ON
            MOVWF  ADCON0        ; WRITE OUT SETTING
LOOP_AD1 BTFSSPIR1, ADIF   ; TEST TO SEE IF CONVERTION DONE, IF HIGH (YES) SKIP NEXT LINE
            GOTO LOOP_AD1  ; NO LOOP TILL DONE
```

−36−

NC83071

```
            BCF   PIR1, ADIF   ; CLEAR A/D CONVERTER INTERRUPT FLAG
            MOVF ADRESH,W      ; GET HIGH BYTE OF A/D CONVERTER RESULT
5           MOVWF  WORD_BUFFER ; PUT IT IN WORD BUFFER
            BSF   STATUS, RP0  ; SELECT PAGE 1
            MOVF ADRESL,W      ; GET LOW NIBBLE OF A/D CONVERTER RESULT
10          BCF   STATUS, RP0  ; SELECT PAGE 0
            MOVWF   TEMP_NIB   ; PUT IN A TEMPORARY NIBBLE BUFFER
            INCF  CURRENT_WORD,W ; INCREMENT CURRENT WORD
15          MOVWF   CURRENT_WORD ; STORE IT
            BSF   WAITING?,0   ; SET WAITING FOR INTERRUPT FLAG
            NOP                ; WAIT FOR ~5 usec TO
            NOP                ; SATISFY THE Tacq REQUIREMENT
            NOP                ;
20          NOP                ;
            NOP                ;
            NOP                ;
            NOP                ;
            NOP                ;
```

−37−

NC83071

```
              NOP            ;
              NOP            ;
              NOP            ;
              BSF    ADCON0,2  ; START A/D CONVERSION
 5            GOTO   MAIN
                             ; READ    PREVIOUS    ANALOG
     CONVERSION
                             ; ANALOG CHANNEL 2 IS SELECTED
     FOR CONVERSION
10                           ; AND CONVERSION IS STARTED
                             ;
     ANALOG2   BCF   STATUS, RP0    ; SELECT PAGE 0
              MOVLW  B'10001001'  ; A/D CONVERSION CLOCK SET
     TO Fosc/32,
15                           ; CHANNEL  2  (AN1) SELECTED,
     CONVERSION NOT
                             ; IN PROCESS, A/D CONVERTER ON
              MOVWF   ADCON0         ; WRITE OUT SETTING
     LOOP_AD2 BTFSSPIR1, ADIF   ; TEST TO SEE IF CONVERTION DONE,
20   IF HIGH (YES) SKIP NEXT LINE
              GOTO LOOP_AD2  ; NO LOOP TILL DONE
              BCF   PIR1, ADIF  ; CLEAR A/D CONVERTER INTERRUPT
     FLAG
```

−38−

NC83071

```
              MOVF  ADRESH,W   ; GET HIGH BYTE OF A/D CONVERTER RESULT
              MOVWF    WORD_BUFFER   ; PUT IT IN WORD BUFFER
5             BSF   STATUS, RP0    ; SELECT PAGE 1
              MOVF  ADRESL,W   ; GET LOW NIBBLE OF A/D CONVERTER RESULT
              BCF   STATUS, RP0    ; SELECT PAGE 0
              MOVWF    TEMP_NIB   ; PUT IN A TEMPORARY NIBBLE BUFFER
10
              INCF  CURRENT_WORD,W   ; INCREMENT CURRENT WORD
              MOVWF    CURRENT_WORD  ; STORE IT
              BSF   WAITING?,0 ; SET WAITING FOR INTERRUPT FLAG
15            NOP              ; WAIT FOR ~5 usec TO
              NOP              ; SATISFY THE Tacq REQUIREMENT
              NOP              ;
              NOP              ;
              NOP              ;
20            NOP              ;
              NOP              ;
              NOP              ;
              NOP              ;
              NOP              ;
```

–39–

NC83071

```
              NOP              ;
              BSF    ADCON0, 2  ; START A/D CONVERSION
              GOTO   MAIN
                             ;   READ   PREVIOUS   ANALOG
5   CONVERSION
                             ; ANALOG CHANNEL 3 IS SELECTED
    FOR CONVERSION
                             ; AND CONVERSION IS STARTED
                             ;
10  ANALOG3     BCF   STATUS, RP0    ; SELECT PAGE 0
              MOVLW  B'10010001'  ; A/D CONVERSION CLOCK SET
    TO Fosc/32,
                             ;  CHANNEL  3  (AN2)  SELECTED,
    CONVERSION NOT
15                           ; IN PROCESS, A/D CONVERTER ON
              MOVWF  ADCON0         ; WRITE OUT SETTING
    LOOP_AD3  BTFSS PIR1, ADIF   ; TEST TO SEE IF CONVERTION DONE,
    IF HIGH (YES) SKIP NEXT LINE
              GOTO LOOP_AD3   ; NO LOOP TILL DONE
20            BCF   PIR1, ADIF  ; CLEAR A/D CONVERTER INTERRUPT
    FLAG
              MOVF ADRESH,W   ; GET HIGH BYTE OF A/D CONVERTER
    RESULT
```

—40—

NC83071

```
         MOVWF   WORD_BUFFER   ; PUT IT IN WORD BUFFER
         BSF   STATUS, RP0     ; SELECT PAGE 1
         MOVF ADRESL,W   ; GET LOW NIBBLE OF A/D CONVERTER RESULT
         BCF   STATUS, RP0     ; SELECT PAGE 0
         MOVWF   TEMP_NIB   ; PUT IN A TEMPORARY NIBBLE BUFFER
         INCF  CURRENT_WORD,W    ; INCREMENT CURRENT WORD
         MOVWF   CURRENT_WORD   ; STORE IT
         BSF   WAITING?,0 ; SET WAITING FOR INTERRUPT FLAG
         NOP              ; WAIT FOR ~5 usec TO
         NOP              ; SATISFY THE Tacq REQUIREMENT
         NOP              ;
         NOP              ;
         NOP              ;
         NOP              ;
         NOP              ;
         NOP              ;
         NOP              ;
         NOP              ;
         NOP              ;
         BSF   ADCON0, 2  ; START A/D CONVERSION
```

−41−

NC83071

```
              GOTO    MAIN
                              ; READ PREVIOUS ANALOG CONVERSION
                              ; ANALOG CHANNEL 4 IS SELECTED FOR CONVERSION
                              ; AND CONVERSION IS STARTED
                              ;
    ANALOG4   BCF    STATUS, RP0    ; SELECT PAGE 0
              MOVLW  B'10011001'    ; A/D CONVERSION CLOCK SET TO Fosc/32,
                              ; CHANNEL 4 (AN3) SELECTED, CONVERSION NOT
                              ; IN PROCESS, A/D CONVERTER ON
              MOVWF  ADCON0         ; WRITE OUT SETTING
    LOOP_AD4  BTFSS  PIR1, ADIF     ; TEST TO SEE IF CONVERTION DONE, IF HIGH (YES) SKIP NEXT LINE
              GOTO   LOOP_AD4       ; NO LOOP TILL DONE
              BCF    PIR1, ADIF     ; CLEAR A/D CONVERTER INTERRUPT FLAG
              MOVF   ADRESH,W       ; GET HIGH BYTE OF A/D CONVERTER RESULT
              MOVWF  WORD_BUFFER    ; PUT IT IN WORD BUFFER
              BSF    STATUS, RP0    ; SELECT PAGE 1
```

−42−

NC83071

```
               MOVF ADRESL,W  ;  GET  LOW  NIBBLE  OF  A/D
     CONVERTER RESULT
               BCF   STATUS, RP0      ; SELECT PAGE 0
               MOVWF    TEMP_NIB   ; PUT IN A TEMPORARY NIBBLE
5    BUFFER
               INCF CURRENT_WORD,W     ; INCREMENT CURRENT
     WORD
               MOVWF    CURRENT_WORD ; STORE IT
               BSF   WAITING?,0 ; SET WAITING FOR INTERRUPT FLAG
10             NOP                ; WAIT FOR ~5 usec TO
               NOP                ; SATISFY THE Tacq REQUIREMENT
               NOP                ;
               NOP                ;
               NOP                ;
15             NOP                ;
               NOP                ;
               NOP                ;
               NOP                ;
               NOP                ;
20             NOP                ;
               BSF   ADCON0, 2  ; START A/D CONVERSION
               GOTO     MAIN
                                ;   READ   PREVIOUS   ANALOG
     CONVERSION
```

−43−

NC83071

```
                              ; ANALOG CHANNEL 5 IS SELECTED FOR CONVERSION
                              ; AND CONVERSION IS STARTED
                              ;
5   ANALOG5    BCF   STATUS, RP0    ; SELECT PAGE 0
               MOVLW B'10100001'    ; A/D CONVERSION CLOCK SET TO Fosc/32,
                                    ; CHANNEL 5 (AN4) SELECTED, CONVERSION NOT
10                                  ; IN PROCESS, A/D CONVERTER ON
               MOVWF ADCON0         ; WRITE OUT SETTING
    LOOP_AD5   BTFSS PIR1, ADIF     ; TEST TO SEE IF CONVERTION DONE, IF HIGH (YES) SKIP NEXT LINE
               GOTO LOOP_AD5        ; NO LOOP TILL DONE
15             BCF   PIR1, ADIF     ; CLEAR A/D CONVERTER INTERRUPT FLAG
               MOVF  ADRESH, W      ; GET HIGH BYTE OF A/D CONVERTER RESULT
               MOVWF WORD_BUFFER    ; PUT IT IN WORD BUFFER
20
               BSF   STATUS, RP0    ; SELECT PAGE 1
               MOVF  ADRESL, W      ; GET LOW NIBBLE OF A/D CONVERTER RESULT
               BCF   STATUS, RP0    ; SELECT PAGE 0
```

—44—

NC83071

```
             MOVWF    TEMP_NIB   ; PUT IN A TEMPORARY NIBBLE BUFFER
             INCF CURRENT_WORD,W    ; INCREMENT CURRENT WORD
5            MOVWF    CURRENT_WORD ; STORE IT
             BSF   WAITING?,0 ; SET WAITING FOR INTERRUPT FLAG
             NOP                ; WAIT FOR ~5 usec TO
             NOP                ; SATISFY THE Tacq REQUIREMENT
             NOP                ;
10           NOP                ;
             NOP                ;
             NOP                ;
             NOP                ;
             NOP                ;
15           NOP                ;
             NOP                ;
             NOP                ;
             BSF   ADCON0, 2   ; START A/D CONVERSION
             GOTO     MAIN
20                              ; READ PREVIOUS ANALOG CONVERSION
                                ; ANALOG CHANNEL 6 IS SELECTED FOR CONVERSION
                                ; AND CONVERSION IS STARTED
```

–45–

NC83071

```
        ;
ANALOG6   BCF   STATUS, RP0      ; SELECT PAGE 0
          MOVLW   B'10101001'   ; A/D CONVERSION CLOCK SET TO Fosc/32,
                                ; CHANNEL 6 (AN5) SELECTED, CONVERSION NOT
                                ; IN PROCESS, A/D CONVERTER ON
          MOVWF   ADCON0        ; WRITE OUT SETTING
LOOP_AD6  BTFSS PIR1, ADIF      ; TEST TO SEE IF CONVERTION DONE, IF HIGH (YES) SKIP NEXT LINE
          GOTO LOOP_AD6         ; NO LOOP TILL DONE
          BCF   PIR1, ADIF      ; CLEAR A/D CONVERTER INTERRUPT FLAG
          MOVF ADRESH,W         ; GET HIGH BYTE OF A/D CONVERTER RESULT
          MOVWF   WORD_BUFFER   ; PUT IT IN WORD BUFFER
          BSF   STATUS, RP0     ; SELECT PAGE 1
          MOVF ADRESL,W         ; GET LOW NIBBLE OF A/D CONVERTER RESULT
          BCF   STATUS, RP0     ; SELECT PAGE 0
          MOVWF   TEMP_NIB      ; PUT IN A TEMPORARY NIBBLE BUFFER
```

NC83071

```
                INCF  CURRENT_WORD,W    ; INCREMENT CURRENT WORD
                MOVWF    CURRENT_WORD  ; STORE IT
                BSF   WAITING?,0 ; SET WAITING FOR INTERRUPT FLAG
5               NOP              ; WAIT FOR ~5 usec TO
                NOP              ; SATISFY THE Tacq REQUIREMENT
                NOP              ;
                NOP              ;
                NOP              ;
10              NOP              ;
                NOP              ;
                NOP              ;
                NOP              ;
                NOP              ;
15              NOP              ;
                BSF   ADCON0, 2  ; START A/D CONVERSION
                GOTO     MAIN
                                 ; READ PREVIOUS ANALOG CONVERSION
20                               ; ANALOG CHANNEL 7 IS SELECTED FOR CONVERSION
                                 ; AND CONVERSION IS STARTED
                                 ;
     ANALOG7    BCF   STATUS, RP0    ; SELECT PAGE 0
```

-47-

NC83071

```
             MOVLW   B'10110001'  ; A/D CONVERSION CLOCK SET TO Fosc/32,
                                  ; CHANNEL 7 (AN6) SELECTED, CONVERSION NOT
                                  ; IN PROCESS, A/D CONVERTER ON
             MOVWF   ADCON0       ; WRITE OUT SETTING
LOOP_AD7     BTFSS   PIR1, ADIF   ; TEST TO SEE IF CONVERTION DONE,
                                    IF HIGH (YES) SKIP NEXT LINE
             GOTO    LOOP_AD7     ; NO LOOP TILL DONE
             BCF     PIR1, ADIF   ; CLEAR A/D CONVERTER INTERRUPT FLAG
             MOVF    ADRESH,W     ; GET HIGH BYTE OF A/D CONVERTER RESULT
             MOVWF   WORD_BUFFER  ; PUT IT IN WORD BUFFER
             BSF     STATUS, RP0  ; SELECT PAGE 1
             MOVF    ADRESL,W     ; GET LOW NIBBLE OF A/D CONVERTER RESULT
             BCF     STATUS, RP0  ; SELECT PAGE 0
             MOVWF   TEMP_NIB     ; PUT IN A TEMPORARY NIBBLE BUFFER
             INCF    CURRENT_WORD,W ; INCREMENT CURRENT WORD
             MOVWF   CURRENT_WORD ; STORE IT
```

−48−

NC83071

```
            BSF    WAITING?,0  ; SET WAITING FOR INTERRUPT FLAG
            NOP                ; WAIT FOR ~5 usec TO
            NOP                ; SATISFY THE Tacq REQUIREMENT
            NOP                ;
            NOP                ;
            NOP                ;
            NOP                ;
            NOP                ;
            NOP                ;
            NOP                ;
            NOP                ;
            NOP                ;
            BSF    ADCON0, 2   ; START A/D CONVERSION
            GOTO   MAIN
                               ; READ PREVIOUS ANALOG CONVERSION
                               ; ANALOG CHANNEL 8 IS SELECTED FOR CONVERSION
                               ; AND CONVERSION IS STARTED
                               ;
   ANALOG8  BCF    STATUS, RP0 ; SELECT PAGE 0
            MOVLW  B'10111001' ; A/D CONVERSION CLOCK SET TO Fosc/32,
```

−49−

NC83071

```
                              ; CHANNEL 8 (AN7) SELECTED, CONVERSION NOT
                              ; IN PROCESS, A/D CONVERTER ON
              MOVWF   ADCON0        ; WRITE OUT SETTING
5   LOOP_AD8  BTFSS PIR1, ADIF  ; TEST TO SEE IF CONVERTION DONE, IF HIGH (YES) SKIP NEXT LINE
              GOTO LOOP_AD8   ; NO LOOP TILL DONE
              BCF   PIR1, ADIF  ; CLEAR A/D CONVERTER INTERRUPT FLAG
10            MOVF ADRESH,W  ; GET HIGH BYTE OF A/D CONVERTER RESULT
              MOVWF   WORD_BUFFER  ; PUT IT IN WORD BUFFER
              BSF   STATUS, RP0     ; SELECT PAGE 1
15            MOVF ADRESL,W  ; GET LOW NIBBLE OF A/D CONVERTER RESULT
              BCF   STATUS, RP0     ; SELECT PAGE 0
              MOVWF   TEMP_NIB  ; PUT IN A TEMPORARY NIBBLE BUFFER
20            INCF CURRENT_WORD,W  ; INCREMENT CURRENT WORD
              MOVWF   CURRENT_WORD  ; STORE IT
              BSF  WAITING?,0 ; SET WAITING FOR INTERRUPT FLAG
              NOP              ; WAIT FOR ~5 usec TO
```

−50−

NC83071

```
            NOP              ; SATISFY THE Tacq REQUIREMENT
            NOP              ;
            NOP              ;
            NOP              ;
5           NOP              ;
            NOP              ;
            NOP              ;
            NOP              ;
            NOP              ;
10          NOP              ;
            BSF    ADCON0, 2  ; START A/D CONVERSION
            GOTO   MAIN
                             ; READ PREVIOUS ANALOG CONVERSION
                             ; ANALOG CHANNEL 9 IS SELECTED FOR
15  CONVERSION
                             ; AND CONVERSION IS STARTED
                             ;
    ANALOG9        BCF  STATUS, RP0    ; SELECT PAGE 0
            MOVLW  B'10000011'  ; A/D CONVERSION CLOCK SET
20  TO Fosc/32,
                             ; CHANNEL  9  (AN8)  SELECTED,
    CONVERSION NOT
                             ; IN PROCESS, A/D CONVERTER ON
            MOVWF  ADCON0    ; WRITE OUT SETTING
```

NC83071

```
LOOP_AD9  BTFSS PIR1, ADIF   ; TEST TO SEE IF CONVERTION DONE,
          IF HIGH (YES) SKIP NEXT LINE
          GOTO LOOP_AD9       ; NO LOOP TILL DONE
          BCF  PIR1, ADIF     ; CLEAR A/D CONVERTER INTERRUPT FLAG
          MOVF ADRESH,W       ; GET HIGH BYTE OF A/D CONVERTER RESULT
          MOVWF WORD_BUFFER   ; PUT IT IN WORD BUFFER
          BSF  STATUS, RP0    ; SELECT PAGE 1
          MOVF ADRESL,W       ; GET LOW NIBBLE OF A/D CONVERTER RESULT
          BCF  STATUS, RP0    ; SELECT PAGE 0
          MOVWF TEMP_NIB      ; PUT IN A TEMPORARY NIBBLE BUFFER
          INCF CURRENT_WORD,W ; INCREMENT CURRENT WORD
          MOVWF CURRENT_WORD  ; STORE IT
          BSF  WAITING?,0     ; SET WAITING FOR INTERRUPT FLAG
          NOP                 ; WAIT FOR ~5 usec TO
          NOP                 ; SATISFY THE Tacq REQUIREMENT
          NOP                 ;
          NOP                 ;
          NOP                 ;
```

-52-

NC83071

```
                NOP         ;
                NOP         ;
                NOP         ;
                NOP         ;
5               NOP         ;
                NOP         ;
                BSF   ADCON0, 2  ; START A/D CONVERSION
                GOTO       MAIN
                            ; READ PREVIOUS ANALOG
10  CONVERSION
                            ; ANALOG CHANNEL 10 IS SELECTED
    FOR CONVERSION
                            ; AND CONVERSION IS STARTED
                            ;
15  ANALOG10  BCF  STATUS, RP0    ; SELECT PAGE 0
              MOVLW   B'10001011'  ; A/D CONVERSION CLOCK SET
    TO Fosc/32,
                            ; CHANNEL 10 (AN9) SELECTED,
    CONVERSION NOT
20                          ; IN PROCESS, A/D CONVERTER ON
              MOVWF   ADCON0         ; WRITE OUT SETTING
    LOOP_AD10 BTFSS PIR1, ADIF   ; TEST TO SEE IF CONVERTION DONE,
    IF HIGH (YES) SKIP NEXT LINE
              GOTO LOOP_AD10 ; NO LOOP TILL DONE
```

−53−

NC83071

```
                BCF    PIR1, ADIF    ; CLEAR A/D CONVERTER INTERRUPT FLAG
                MOVF ADRESH,W       ; GET HIGH BYTE OF A/D CONVERTER RESULT
5               MOVWF  WORD_BUFFER  ; PUT IT IN WORD BUFFER
                BSF    STATUS, RP0  ; SELECT PAGE 1
                MOVF ADRESL,W       ; GET LOW NIBBLE OF A/D CONVERTER RESULT
10              BCF    STATUS, RP0  ; SELECT PAGE 0
                MOVWF  TEMP_NIB     ; PUT IN A TEMPORARY NIBBLE BUFFER
                INCF   CURRENT_WORD,W ; INCREMENT CURRENT WORD
15              MOVWF  CURRENT_WORD ; STORE IT
                BSF    WAITING?,0   ; SET WAITING FOR INTERRUPT FLAG
                NOP                 ; WAIT FOR 5 usec TO
                NOP                 ; SATISFY THE Tacq REQUIREMENT
                NOP                 ;
20              NOP                 ;
                NOP                 ;
                NOP                 ;
                NOP                 ;
                NOP                 ;
```

–54–

NC83071

```
         NOP           ;
         NOP           ;
         NOP           ;
         BSF   ADCON0,2 ; START A/D CONVERSION
5        GOTO  MAIN

END           ; directive 'end of program'
```

What is claimed is:

1. A pulse code modulation encoder, comprising:
- a programmable controller arranged to receive a digital signal input and a plurality of parallel analog signal inputs, said programmable controller being arranged to digitize the parallel analog signal inputs and modulate them with the digital signal input;
- a system clock connected to said programmable controller;
- a counter circuit connected to said system clock and to said programmable controller to provide interrupt signals thereto; and
- a shift register connected to said programmable controller to receive modulated parallel digital signals corresponding to the parallel analog signal inputs to said programmable controller said shift register being also connected to said counter and being arranged to function as a parallel to serial converter to provide a serial data stream output at an output terminal of said shift register.

2. The pulse code modulation encoder of claim 1, further comprising an operational amplifier array arranged to provide the parallel analog signal inputs to said programmable controller.

3. The pulse code modulation encoder of claim 2, further comprising a line receiver connected to said programmable controller, said line receiver being arranged to receive a balanced digital and provide a unipolar digital signal to said programmable controller for modulating digital signals corresponding to the parallel analog signal inputs.

4. The pulse code modulation encoder of claim 3, further comprising:
- an output buffer connected to said output terminal of said shift register; and
- a filter circuit connected to said output buffer to provide a filtered, encoded signal output.

5. The pulse code modulation encoder of claim 1, further comprising a line receiver connected to said programmable controller, said line receiver being arranged to receive a balanced digital and provide a unipolar digital signal to said programmable controller for modulating digital signals corresponding to the parallel analog signal inputs.

6. The pulse code modulation encoder of claim 1, further comprising:
- an output buffer connected to said output terminal of said shift register; and
- a filter circuit connected to said output buffer to provide a filtered, encoded signal output.

* * * * *